US012684725B2

(12) United States Patent
    Unger et al.

(10) Patent No.:     US 12,684,725 B2
(45) Date of Patent:        Jul. 14, 2026

(54) ELECTRONIC ASSEMBLY AND METHOD FOR PRODUCING AN ELECTRONIC ASSEMBLY

(71) Applicant: Turck Holding GmbH, Halver (DE)

(72) Inventors: Kay Unger, Lauter-Bernsbach (DE);
                Christian Leonhardt, Chemnitz (DE);
                Jan Kiesel, Holzwickede (DE)

(73) Assignee: Turck Holding GmbH, Halver (DE)

( * ) Notice:   Subject to any disclaimer, the term of this
                patent is extended or adjusted under 35
                U.S.C. 154(b) by 93 days.

(21) Appl. No.: 18/755,826

(22) Filed:     Jun. 27, 2024

(65)            Prior Publication Data

US 2025/0008678 A1      Jan. 2, 2025

(30)        Foreign Application Priority Data

Jun. 30, 2023    (DE) ...................... 10 2023 117 285.9

(51) Int. Cl.
     *H05K 7/14*          (2006.01)
     *G01D 11/24*         (2006.01)
                (Continued)
(52) U.S. Cl.
     CPC ......... *H05K 7/1427* (2013.01); *G01D 11/245*
            (2013.01); *H01R 12/71* (2013.01);
                (Continued)
(58) Field of Classification Search
     CPC ................... H05K 7/1427; H05K 1/18; H05K
            2201/10151; G01D 11/245; H01R 12/71;
                (Continued)

(56)                References Cited

U.S. PATENT DOCUMENTS 4,378,504 A *   3/1983  Yamasaki .......... H03K 17/9505
                                                       307/116
    4,680,543 A *   7/1987  Kohen .................... G01P 3/488
                                                       174/521
                    (Continued)

FOREIGN PATENT DOCUMENTS

DE          33 25 462 A1      3/1985
    DE          3325462 C2 *      7/1986
                    (Continued)

OTHER PUBLICATIONS

Extended European Search Report issued in EP 24 184 568.4, which
is a counterpart hereof, mailed Nov. 20, 2024 and English language
machine translation thereof.
                    (Continued)

*Primary Examiner* — Allen L Parker
*Assistant Examiner* — Martin Antonio Asmat Uceda
(74) *Attorney, Agent, or Firm* — Pearl Cohen
Patentanwälte PartGmbB; Michael McCandlish

(57)                ABSTRACT

An electronic assembly comprises a housing, a plug, an
electronics board, a sensor board, and a front cap; wherein
the housing includes, from a rear side to a front side thereof,
in succession the plug, the electronics board, the sensor
board, and the front cap; wherein a collar, on which an axial
end face of the plug is supported, is provided at the rear side
of the housing such that the plug cannot be pulled out from
the rear side of the housing; wherein the plug, the electronics
board, and the sensor board form an assembled structural
unit; and wherein a front of the housing is crimped around
the front cap to fix the structural unit in the housing and press
the structural unit against the collar.

12 Claims, 6 Drawing Sheets

(51) Int. Cl.

| | |
|---|---|
| *G01S 7/521* | (2006.01) |
| *H01R 12/71* | (2011.01) |
| *H01R 12/72* | (2011.01) |
| *H01R 12/73* | (2011.01) |
| *H01R 13/40* | (2006.01) |
| *H01R 43/20* | (2006.01) |
| *H05K 1/18* | (2026.01) |

(52) U.S. Cl.
CPC ............. *H01R 12/73* (2013.01); *H01R 13/40*
(2013.01); *H01R 43/20* (2013.01); *H05K 1/18*
(2013.01); *G01S 7/521* (2013.01); *H01R*
*12/722* (2013.01); *H05K 2201/10151*
(2013.01)

(58) Field of Classification Search
CPC ...... H01R 13/40; H01R 12/722; H01R 12/73;
H01R 43/20; G01S 7/521
See application file for complete search history.

(56) References Cited

U.S. PATENT DOCUMENTS

| | | | | |
|---|---|---|---|---|
| 4,875,009 | A * | 10/1989 | Leveque | G01B 7/02 |
| | | | | 324/207.16 |
| 4,937,936 | A * | 7/1990 | Schill | H01R 13/7197 |
| | | | | 333/182 |
| 5,121,289 | A * | 6/1992 | Gagliardi | G01D 5/147 |
| | | | | 174/559 |
| 5,278,496 | A * | 1/1994 | Dickmeyer | G01P 1/026 |
| | | | | 174/541 |
| 5,351,388 | A * | 10/1994 | Van Den Berg | G01P 1/00 |
| | | | | 336/205 |
| 5,659,246 | A * | 8/1997 | Togo | G01D 11/245 |
| | | | | 324/174 |
| 5,712,562 | A * | 1/1998 | Berg | G01K 7/02 |
| | | | | 324/207.16 |
| 5,789,920 | A * | 8/1998 | Gass | B29C 70/84 |
| | | | | 324/262 |
| 5,818,224 | A * | 10/1998 | Van Den Berg | G01B 7/001 |
| | | | | 324/207.16 |
| 6,334,361 | B1 * | 1/2002 | De Volder | B29C 33/126 |
| | | | | 73/431 |
| 6,693,418 | B2 * | 2/2004 | Kubik | G01P 3/488 |
| | | | | 324/174 |

| | | | | |
|---|---|---|---|---|
| 6,965,228 | B2 * | 11/2005 | Muller | H03K 17/9505 |
| | | | | 336/84 R |
| 7,145,348 | B2 * | 12/2006 | Nakazaki | H03K 17/945 |
| | | | | 361/818 |
| 7,394,243 | B2 * | 7/2008 | Tsuchida | H03K 17/954 |
| | | | | 324/207.13 |
| 7,649,349 | B2 | 1/2010 | Schoen et al. | |
| 8,966,975 | B2 * | 3/2015 | Campbell | H05K 3/284 |
| | | | | 73/493 |
| 10,273,788 | B2 * | 4/2019 | Bradley | F42B 3/08 |
| 11,223,164 | B2 * | 1/2022 | Gutmann | H01R 13/645 |
| 11,248,937 | B2 * | 2/2022 | Steinbrink | H01R 13/562 |
| 12,300,947 | B2 * | 5/2025 | Messadek | H01R 13/5816 |
| 2007/0057665 | A1 * | 3/2007 | Borst | G01D 11/245 |
| | | | | 324/207.2 |
| 2008/0030973 | A1 * | 2/2008 | Mascha | G01D 11/245 |
| | | | | 29/841 |
| 2009/0188321 | A1 | 7/2009 | Schoen | |
| 2010/0039756 | A1 | 2/2010 | Steinich | |
| 2010/0207295 | A1 * | 8/2010 | Goetz | G01P 1/026 |
| | | | | 264/294 |
| 2011/0260713 | A1 * | 10/2011 | Schleyer | G01P 3/488 |
| | | | | 324/174 |
| 2015/0276556 | A1 * | 10/2015 | Biegner | G01L 17/005 |
| | | | | 73/584 |
| 2016/0268737 | A1 | 9/2016 | Gutmann et al. | |
| 2017/0010336 | A1 * | 1/2017 | Hwang | G01V 3/08 |
| 2018/0161088 | A1 * | 6/2018 | Poser | A61B 18/148 |
| 2023/0204401 | A1 * | 6/2023 | Tschudin | G01F 1/588 |
| | | | | 73/861.12 |
| 2024/0302909 | A1 * | 9/2024 | Tanaka | G06F 3/0442 |

FOREIGN PATENT DOCUMENTS

| | | | | |
|---|---|---|---|---|
| DE | 10 2008 006 746 A1 | 8/2009 | | |
| DE | 10 2008 037 667 A1 | 2/2010 | | |
| DE | 10 2015 103 551 A1 | 9/2016 | | |
| DE | 10 2017 201 320 B3 | 3/2018 | | |
| DE | 10 2017 129 687 B4 | 11/2018 | | |
| EP | 0779500 B1 * | 7/2001 | .......... | G01D 11/245 |
| EP | 1 695 037 B1 | 11/2016 | | |

OTHER PUBLICATIONS

Search Report issued in DE 10 2023 117 285.9, to which this application claims priority, mailed Jun. 13, 2024 (English-language machine translation attached).

* cited by examiner

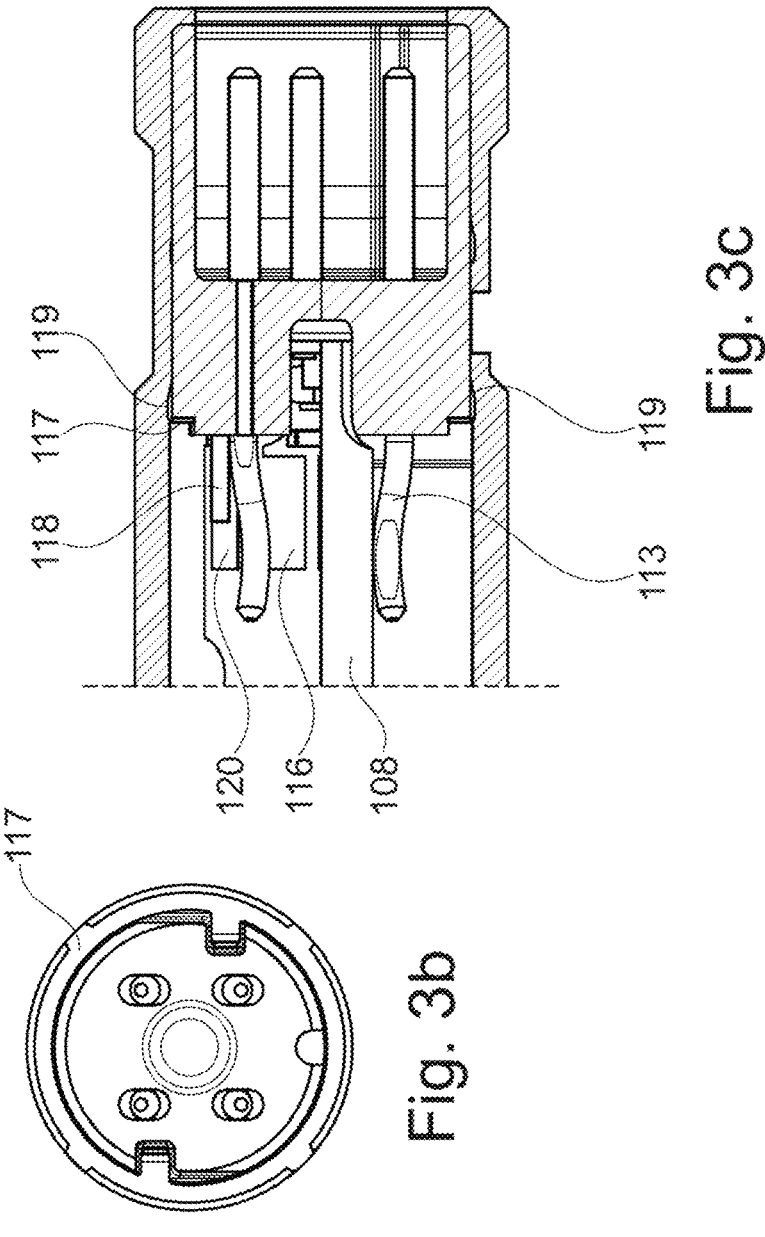
Fig. 3c
Fig. 3b
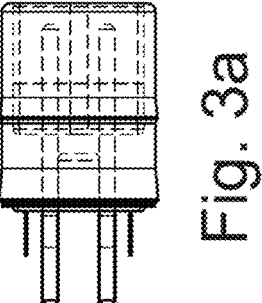
Fig. 3a

--Prior Art--

ELECTRONIC ASSEMBLY AND METHOD FOR PRODUCING AN ELECTRONIC ASSEMBLY

CROSS REFERENCE TO RELATED APPLICATIONS

This application claims priority to German patent application 10 2023 117 285.9 filed on Jun. 30, 2023, which is hereby incorporated by reference in its entirety.

TECHNICAL FIELD

The present disclosure relates to an electronic assembly and to a method for producing such an electronic assembly. An example of such an electronic assembly can be a proximity switch or any other electronic switching device.

BACKGROUND

An electronic switching device from the prior art, as disclosed in DE 10 2017 201 320 B3, is shown in FIG. 5. It has a housing with a cylindrical section 5. A circuit carrier 2 and a sensor unit 1 are accommodated in this cylindrical section 5. The sensor unit 1 is configured in this example of application from the prior art in the form of a wound front coil. The sensor unit defines a front side of the electronic switching device, wherein the plug 3 defines a rear side of the electronic switching device.

To affect a sealing of the electronic components in the interior of the housing, a situation is described in DE 10 2017 201 320 B3 in which the plug 3 is pushed into the housing from the rear side and the threaded tube 6 is crimped to a perforated disk 7 and the cylindrical section 5. A flexible polyurethane foam 4 is provided in the interior of the electronic switching device such that a sealing effect is achieved. DE 10 2017 201 320 B3 is differentiated from the prior art simply in that this flexible foam is used instead of an epoxy resin, where this is reported to cause an unfavourable seal.

Further relevant prior art is described in DE 10 2017 129 687 B4 and EP 1 695 037 B1. An example of a structure of a switching device with a shielding sleeve for shielding from electromagnetic radiation is described in EP 1 695 037 B1.

One object of the present disclosure can be to provide a simplified method for an automated production of an electronic assembly, or an electronic assembly which can be produced cost-effectively.

SUMMARY

The electronic assembly has a housing, a plug, an electronics board, a sensor board, and a front cap. The housing can have a cylindrical or tubular form. Any other form of housing is also possible. The housing usually has an axial extent in a direction of extent from a front side to a rear side. The housing receives, from the rear side to a front side, in succession the plug, the electronics board, the sensor board, and the front cap.

The plug can be produced as a separate element and has, for example, a plug housing in which one or more pins are provided which ensure the plug functionality.

The plug contacts, for example, a first end of the electronics board. The electronics board can be, for example, a planar element with electronic components installed thereon. A sensor board can correspondingly then be contacted with the electronics board at a second end of the electronics board.

The plug, the electronics board, and the sensor board can form an assembled structural unit. An assembled structural unit can be a structural unit in which the electronics board and the sensor board are connected to each other, for example, by soldering and/or by additional overmolding, for example by hotmelt methods and thus form an assembled structural unit. This structural unit can then be pushed as a whole from the front side into the housing.

After this assembled structural unit has been pushed in, for example an axial end surface interacts with a collar which is provided on the rear side of the housing such that the plug cannot be pulled out from the rear side of the housing.

The front side of the housing can be closed and/or sealed around the front flap, for example, by crimping such that the structural unit is fixed in the housing and is pressed against the collar.

Simple production of the electronic assembly can thus be possible and the replacement of individual parts can also be ensured.

The plug can include the plug housing and plug pins. The plug pins can be held in the plug housing. The rear-side end of the pins, which can be in contact with the first end of the electronics board, can be configured as crescent-shaped. Even if the plural "pins" is described in the present case, just a single pin can also be provided and form the plug.

The crescent-shaped or alternatively banana-shaped configuration in connection with the contacting pads on the board at which the pins establish contact with the electronics boards can enable simple contacting and fixing.

Optionally, the pins are in each case arranged in the plug housing such that the crescent-shaped elements are situated opposite one another such that they are applied between them in the manner of claws against the electronics board at the corresponding contacting pads and pre-fix the contacting pads before they are then, as described below, connected to the contacting pads by soldering, optionally in a selective soldering process.

The pins can be drawn from a solid material. This can enable a more stable configuration and a mechanically less fragile connection.

Optionally, the pins are produced, for example, from brass. Any other conductive material can, however, also be used, optionally metal material.

A grounding element can be provided which is provided between the electronics board and the housing at an end of the plug housing at which the electronics board is situated. The grounding element can be produced from metal. Any other electrically conductive material can, however, also be used. The housing can be produced from an electrically conductive material, for example metal.

The grounding element can be formed by a sheet-metal ring which has at least one soldering lug for contacting a ground contacting pad of the electronics board, which contact pad is connected to a capacitor on the electronics board. The sheet-metal ring can have at least one press-fit lug protruding therefrom which establishes an electrically conductive contact with the housing. Optionally, precisely two soldering lugs are provided which receive the electronics board between them. Additionally, Four press-fit lugs can be provided on the sheet-metal ring. The press-fit lug can be, for example, a local radial widened portion of the ring.

The assembled structural unit can be at least partly (optionally only the electronics board and the sensor board, but not the plug) surrounded by an injection-molded sleeve. This injection-molded sleeve can be produced by a low-pressure injection-molding method and the structural unit thus can form a captive and integral unit and this structural unit can be inserted with its injection-molded sleeve into the housing.

To ensure the functionality of sensitive electronic components such as boards, sensors, or other electronic components, they can be protected from negative environmental influences. For example, the low-pressure injection-molding method can be used here which can enable effective sealing of electronic components.

Individual requirements in terms of flexibility, impact resistance, leaktightness, UV protection, chemical resistance, and color can be considered by the use of different materials. This can ensure optimal adaptation to the specific requirements of the respective components.

In the low-pressure injection-molding method, the components can be placed in a mold and encased with the hot melt adhesive. An injection pressure of 1.5 to 40 bar and an operating temperature range of –50° to +200° C. can be used. By virtue of this molding technique, not only can the components be protected from corrosion and environmental influences but also bores and screw threads can be integrated to ensure further improved functionality.

The contour of the injection-molded sleeve can correspond to an internal contour of the housing in as much as the housing has a tubular cross-section and this injection-molded sleeve also has the shape of a tube. However, the contour of the injection-molded sleeve can, for example, take into consideration the coefficients of thermal expansion of the thermoplastic and leave free a defined buffer region for the thermal expansion relative to the housing. The structural unit with the injection-molded sleeve can thus be held only by the crimped side of the housing at the front and the collar at the rear side, and the electronic assembly can thus also be disassembled again more easily. By virtue of its low adhesive force compared with typical potting compounds, optionally based on thermosetting or elastomeric plastic compounds, for example epoxy resins or thermosetting plastic compounds or silicone compounds or elastomeric plastic compounds, the use of thermoplastic can also enable subsequent mechanical removal of the plastic, for which reason repair work on the board or also recycling of the individual components can be made possible.

The injection-molded sleeve can have an integrally connected sealing lip; for example, if the injection-molded sleeve has a tube-shaped design, the sealing lip can run around the circumference of the tube to ensure a watertight seal with respect to the inner wall of the housing.

The electronic assembly described very generally above can be formed, for example, by a proximity switch or by any other electronic switch, or can comprise such a switch. Further types of sensors are the following: an inductive sensor, a capacitive sensor, a pressure sensor, a gas sensor, a temperature sensor, a moisture sensor, an ultrasound sensor, a vibration detection sensor, a UV sensor.

A method for producing an electronic assembly is specified. The assembly can be an abovementioned assembly.

The method features specified below for the method can also be provided, in a device-appropriate form, for the electronic assembly.

In the method, first the rear ends of pins of the plug can be contacted with a first end of the electronics board. In addition, the contacts of the sensor board can be contacted with the corresponding contacts of the electronics board at the second end of the electronics board. The plug, the electronics board, and the sensor board can thus form an assembled structural unit. The two abovementioned contacting steps can also be carried out readily in the reverse order.

The assembled structural unit can then include the injection-molded sleeve as an integral part, which sleeve can be produced by the low-pressure injection-molding method.

The structural unit can then be inserted into the housing from the front side toward a rear side until an axial end face of the plug is supported on the collar at the rear side of the housing. Moreover, the housing can be closed at the front side with the cap and the rear side of the housing can be crimped around the front cap such that the structural unit is fixed in the housing and pressed against the collar.

The cap can also be provided or fitted already on the front side of the structural unit before the latter is plugged into the housing and then there is no need for it to be attached only after the structural unit has been plugged in.

The method can further comprise the steps of injection-molding at least parts of the structural unit such that the structural unit is surrounded by an injection-molded sleeve.

The injection-molded sleeve can be produced from a thermoplastic. The contour of the injection-molded sleeve can take into consideration, for example, the coefficients of thermal expansion of the thermoplastic and leaves free a defined buffer region for the thermal expansion relative to the housing. The injection-molded sleeve can be produced by the abovementioned low-pressure injection-molding method.

The contacting of the rear-side ends of the pins of the plug with the first ends of the board, and alternatively or additionally the contacting of the contacts of the sensor board with the corresponding contacts of the electronics board and with the second end of the electronics board, can be affected by a selective soldering process.

In the manufacturing of the assemblies, selective soldering can replace, expressed in simplified terms, soldering by hand. It is an automated 3D soldering method which can be controlled via software. X, Y, and Z coordinates can be here fixed on the board. The coordinates can identify at which points on the circuit board the hot solder is deposited in order to solder very specific components. For example, a conical nozzle can approach the board from below and place the points of solder point-by-point. The selective soldering process can be, for example, also recorded on video.

Selective soldering can also be performed via a mini-wave. Selective soldering with a mini-wave can be suitable in the case of a relatively large number of solder points. Mini-waves can be used when there is as little as 2 mm of free space around the soldering area. The method can be used flexibly for very different solder points by quick-change nozzle sets.

The selective soldering method can be derived from wave soldering in which the soldering area has been restricted by decreasing the solder wave or reducing the soldering bath to small soldering nozzles.

In the method, the workpiece can be dipped into a "stationary" mini-wave. In order to break off the oxide layer which is formed on the upper surface, the solder wave can flow inside the nozzle, i.e. internally. To reduce the formation of oxide at the nozzle outlet and to improve the solder joint, nitrogen can, for example, be flowed around the nozzle.

The contacts at the first and/or second end of the electronics board can thus, for example, be produced with a single wave. All the contacts between the sensor board and the electronics board or between the pins and the electronics board can thus be produced in one method pass or two selective soldering method steps, one for the sensor-side end and one for the plug-side end, when the wave is moved over the contacting area in one pass.

The above-described method can be performed in an automated manner and, optionally, the individual steps are not performed manually.

BRIEF DESCRIPTION OF THE DRAWINGS

Further optional details of the disclosure will be described below in conjunction with the FIGS., in which:

FIG. 3a shows the further side view, offset by 90 degrees compared with the view from FIG. 2b, of the plug housing (cf. view in the direction of the arrow D in FIG. 2c);

FIG. 3b shows a view of the side of the plug housing which is directed toward the electronics board;

FIG. 3c shows a schematic view of how the plug housing is held in the housing with the electronics board fitted thereon;

DESCRIPTION

The following description as well as the drawings to which the description refers are provided for exemplary purposes only and are not intended to limit the scope of the disclosure in any way.

Figures 1A, 1B, 1C:
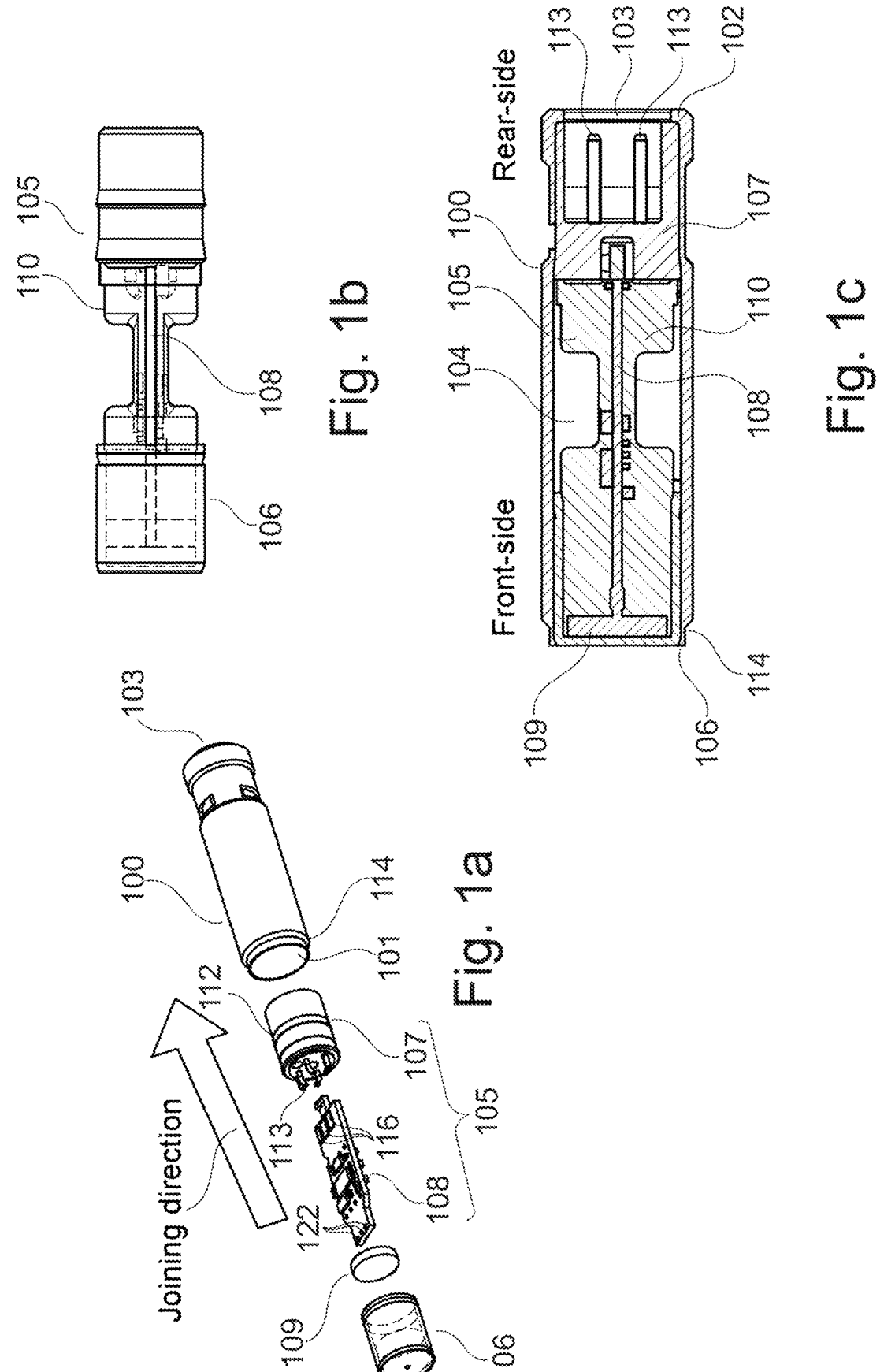
FIG. 1a shows an exploded view of an electronic assembly in its joining direction.
FIG. 1b shows a side view with a structural unit consisting of a plug, an electronics board, and a sensor board, wherein the front cap is already provided on the front side.
FIG. 1c shows the structural unit from FIG. 1b, inserted into the housing, in a view in cross-section.

FIG. 1a shows a housing with the reference symbol 100.

In the present case, it is designed as cylindrical, namely tubular. The housing 100 thus has an axial direction.

The housing 100 has a front opening 101 on its front side.

On a rear side of the housing 100, as can be seen in FIG. 1c, a collar 102 is provided which is formed by an inwardly bent end of the housing 100.

The housing 100 in any case also has at the rear side a rear-side opening 103 with a cross-section which is smaller than that of the front-side opening 101.

As can be seen from the view in cross-section in FIG. 1c, the housing has internally a cylindrical internal circumferential surface 104.

A structural unit 105, which is described below, is inserted into the front opening 101 in the housing.

Then, this not being visible in the view in cross-section in FIG. 1c, the housing is crimped at its front-end side and thus at least partially placed around the edge of a front cap 106 such that the structural unit 105 is held fixed in the housing and an axial end face of the plug 107 interacts with the collar 102. An axial end face of the plug 107 can be thus supported on the collar 102 in the axial direction.

Further parts of the electronic assembly can be seen in FIG. 1a.

These are the plug 107, the electronics board 108, and the sensor board 109.

In the example, the front cap 106 is not considered as part of the structural unit 105 and instead viewed as a separate element.

The plug 107, the electronics board 108, and the sensor board 109 are connected to one another via subsequent soldering, for example in the present case via selective soldering.

The elements the plug 107, the electronics board 108, and the sensor board 109 which are provided in the example form the structural unit 105. The latter is illustrated in FIG. 1b in a side view.

The structural unit 105 is, this not being visible in FIG. 1a, partly surrounded by an injection-molded sleeve 110. That is, the plug 107 can be the only part of the structural unit that is not surrounded by the injection-molded sleeve 110. This injection-molded sleeve 110 can be produced by a low-pressure injection-molding method.

The injection-molded sleeve 110 has a thickened portion at a second side which is situated at the front side of the housing 100, and at a first side which is situated at a rear side of the housing 100. In each case a so-called sealing lip is, for example, produced there.

These sealing lips are supported on the inner wall of the housing 100 in order to seal the latter.

In the region of the electronics board where a diode, not illustrated in detail in the FIGS., can be provided, the injection-molded sleeve 110 can be thinner and/or have an opening.

By virtue of the injection overmolding, optionally in the low-pressure injection-molding method, a captive structural unit can be produced which can then be inserted into the interior of the housing 100 with an exact fit.

The plug has a plug housing 112 and pins 113 held therein.

Figure 2C:
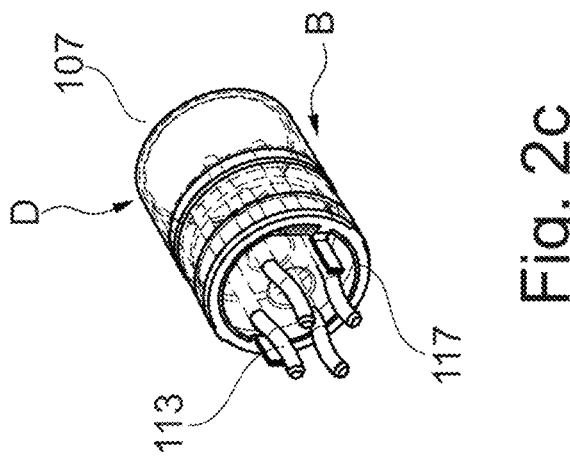
FIG. 2c shows a perspective view of the plug housing.
Figure 2B:
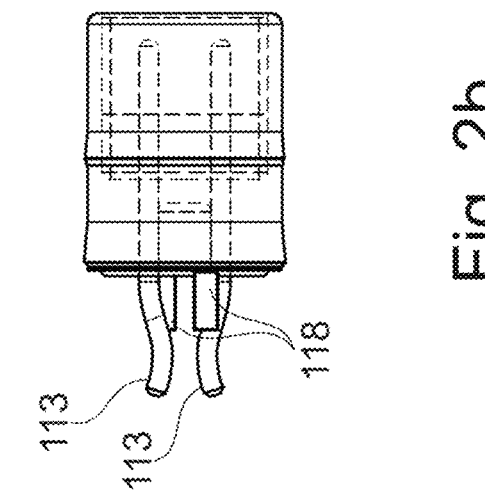
FIG. 2b shows a corresponding side view of the plug housing from FIG. 2a without the fitted electronics board (cf. view in the direction of the arrow B in FIG. 2c)

The pins 113 each have a crescent-shaped configuration on that side with which the electronics board 108 is contacted and in the present example are drawn from a solid material. As can be seen in FIGS. 2c and 3b, in the present case four such pins 113 are provided.

3-pin plugs or plugs with more than four pins are of course in a similar fashion also conceivable in addition to the 4-pin plug specified herein.

The cross-section of the pins 113 is designed as essentially round or oval on that side on which the electronics board 108 is situated. In the present case, the pins are designed with a round cross-section over their entire length.

Figure 2A:
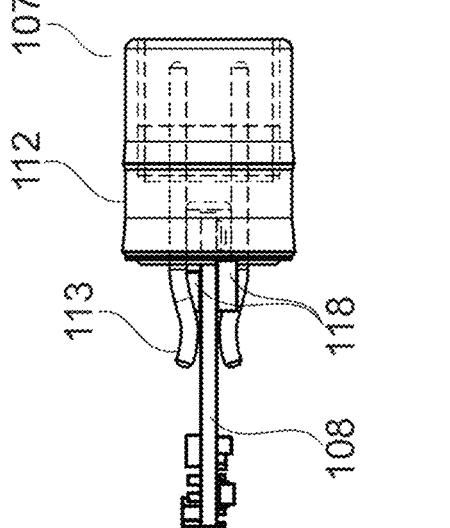
FIG. 2a shows a side view of the plug housing and the electronics board connected thereto.
Figure 4A:
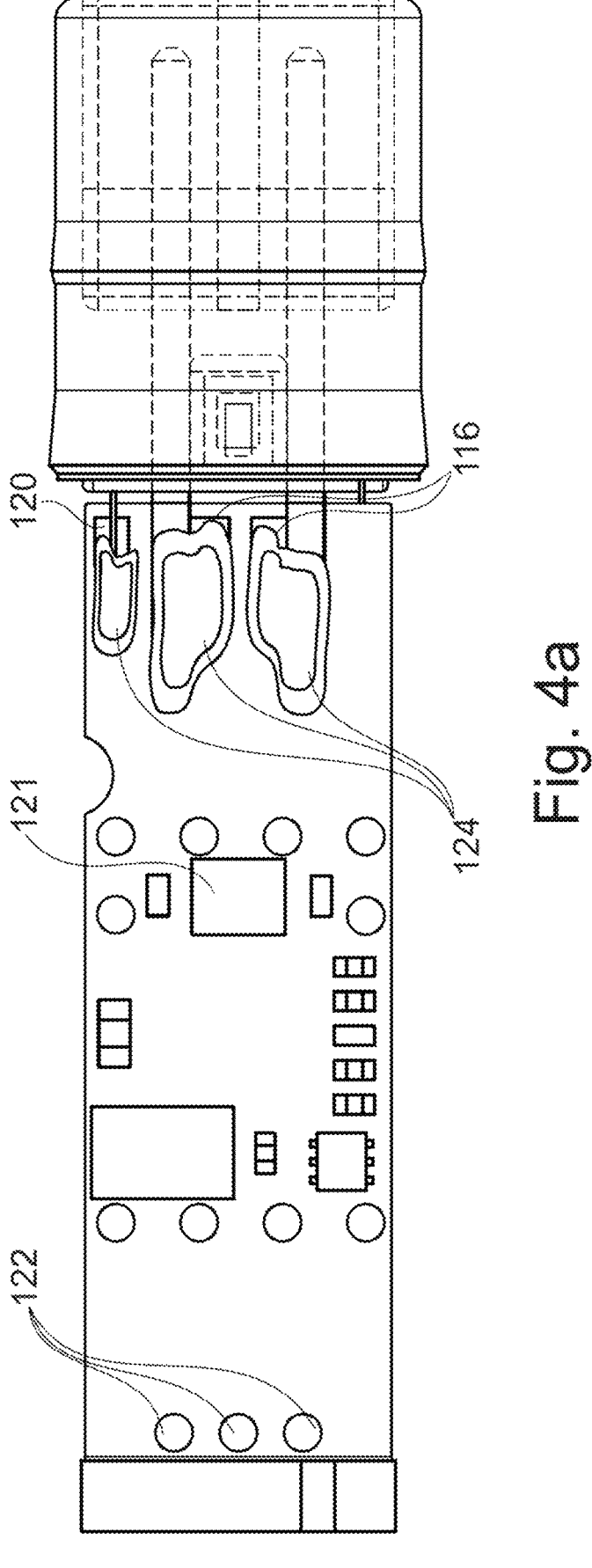
FIG. 4a shows a view from the direction of the arrow D in FIG. 2c of the arrangement consisting of the plug housing and the electronics board connected thereto.

Viewed from a front-side end, the pins 113 are configured as bent in a rear section. In each case two pins 113 situated opposite each other receive, as can be seen in FIGS. 2a and 3c, the electronics board between them and contact the plug-side contacting pads 116 provided in FIG. 4 on the electronics board 108. The bend in the pins is banana-shaped, wherein those ends of the pins 113 which are on the electronics board side point away from the electronics board 108 slightly in a radial direction. Two bulges, situated opposite each other, of the banana-shaped bend in the pins 113 form a shortest gap between the two pins situated opposite each other and receive there, for example, the electronics board 108 between them, optionally with pretension.

In addition to the pins 113, the plug also has a sheet-metal ring 117 with two soldering lugs 118 (cf. FIG. 2c, FIGS. 3b and c). The sheet-metal ring 117 additionally has press-fit lugs 119 protruding therefrom, also in the radial direction. The sheet-metal ring 117 is fitted in an axial direction of the structural unit on the plug housing 112 at that end of the plug housing 112 situated on the electronics board side. The plug housing 112 with the pins 113 and the sheet-metal ring can thus form an independent unit which can then be used, for example, as a prefabricated part in the automatic production of the structural unit 105 or the whole electronic assembly.

The soldering lugs 118 and the press-fit lugs 119 are provided as integral parts of the sheet-metal ring 117 which can be produced as a stamped part. Even though in the present case two soldering lugs 118 and four press-fit lugs 119 are provided, it is not necessary that the grounding of the electronics board 108 via the housing 100 be affected via the specific configuration and/or number of the soldering lugs 118 and press-fit lugs 119. The sheet-metal ring 117 is an example of a grounding element which is provided between the electronics board 108 and the housing 100 at that end of the plug housing 112 situated on the electronics board side.

In the present case, the soldering lugs 118 are designed as plate-like tabs, the plate surface of which is perpendicular to the electronics board 108. Also provided on the electronics board 108 in addition to the plug-side contacting pads 116 are further ground contacting pads 120 which establish contact with a capacitor 121 fitted on the electronics board (cf. FIG. 4a, FIG. 3c). In the present case, the electronics board 108 has a single ground contacting pad 120 and two plug-side contacting pads 116 on each of the underside and upper side, corresponding to the number and position of the pins 113 and soldering lugs 118. The side edges of the two soldering lugs 118 receive the electronics board 108 between them and stabilize the arrangement.

The shielding sleeve described in the document EP 1 695 037 B1 mentioned at the beginning is, for example, in the present case by the capacitive connection via the sheet metal (sheet-metal ring 117) on the plug, which establishes a conductive connection to the housing and is soldered to the electronics board, as a result of which AC interference over the housing can be discharged via a capacitor which is connected to ground (GND). The advantage of this is that there is no need for an additional shielding sleeve or for an additional contacting process for the latter (soldering process).

The soldering lugs 118 are, for example, simultaneously soldered to the pins 113 by the selective soldering method. The shaping of the crescent-shaped or banana-shaped plug pins is here also again advantageous for the selective soldering method which enables the pins to be wetted reproducibly simultaneously with the soldering finger and consequently a very short soldering time to be obtained, optionally less than 5 s.

In the case of the electronics board 108, individual contacting pads (plug-side contacting pads 116) are illustrated in FIG. 1a on the right-hand side. The contacting with the pins 113 takes place via these plug side contacting pads 116.

In the case of the electronics board 108, three contacting pads (sensor-side contacting pads 122) are also illustrated on the left-hand side in FIG. 1a which are in contact, for example, with pins (not illustrated) of the sensor board 109.

The contact is made via soldering, optionally selective soldering.

For example, the contacting of the pins of the plug with the contacting pads of the electronics board 108, and also the contacting of the pins of the sensor board 109 with the contacting pads of the electronics board 108, are effected in each case in a single soldering step, for example via a mini-wave which is moved over or through the area to be soldered, such that the individual pins are simultaneously selectively soldered. During this selective soldering step of soldering the pins 113, the soldering lugs 118 can also simultaneously be soldered to the ground contacting pads 120.

A selective soldering method is characterized in that selectively the individual pins are soldered and the connection to the whole board is not soldered at the same time.

The connection of the contacts of the sensor board 109 to the sensor-side contacting pads 122 can also take place in a single selective soldering step which is carried out in addition to the selective soldering step for the purpose of contacting the plug.

Figures 4B, 4C, 4D, 4E:
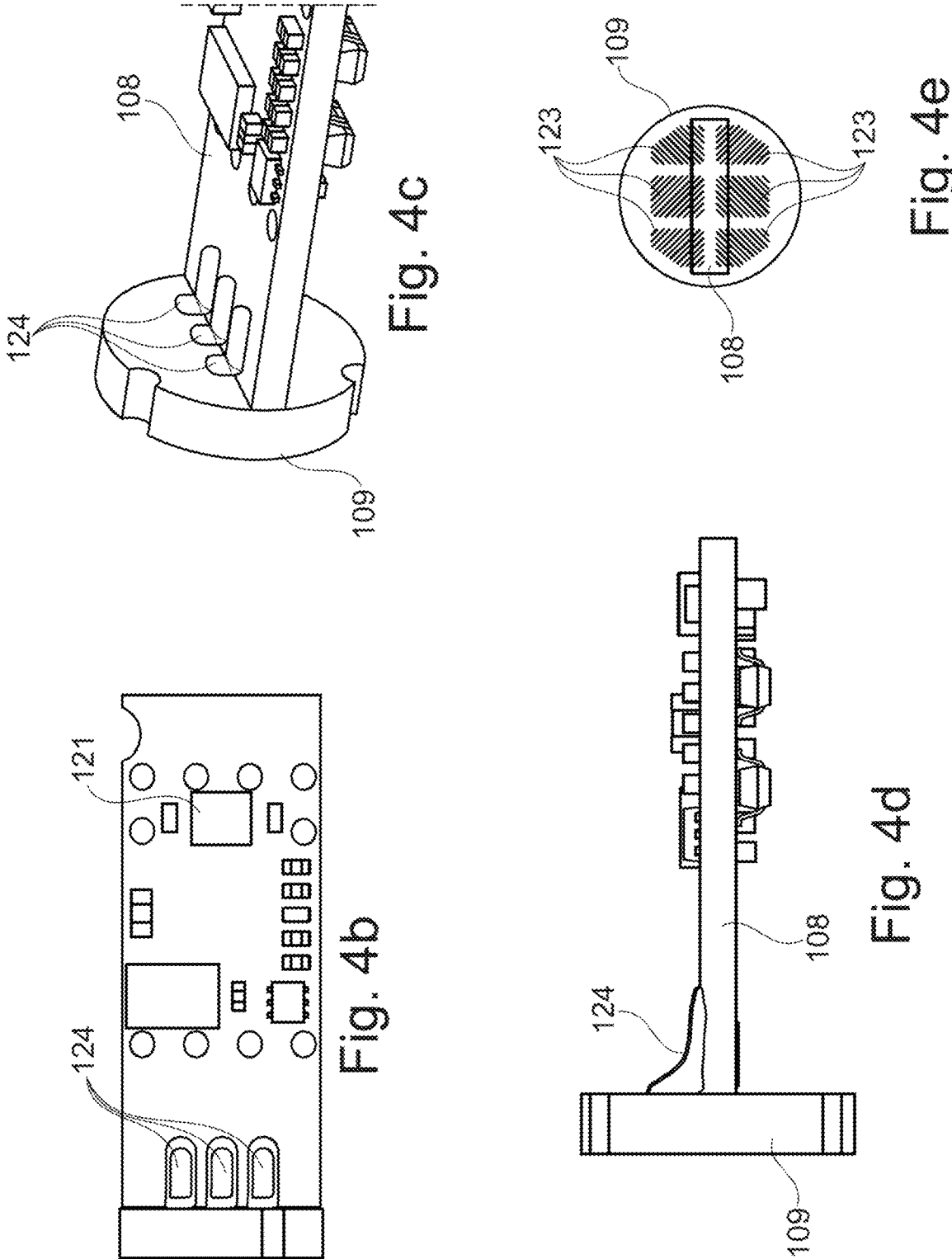
FIG. 4b shows a section of the electronics board with its end which is attached to the sensor board.
FIG. 4c shows an oblique view of the connecting region between the electronics board and the sensor board.
FIG. 4d shows a side view of the arrangement from FIG. 4b.
FIG. 4e shows a sketch of the connection between the contacts of the sensor board and the corresponding contacts of the electronics board.
Figure 5:
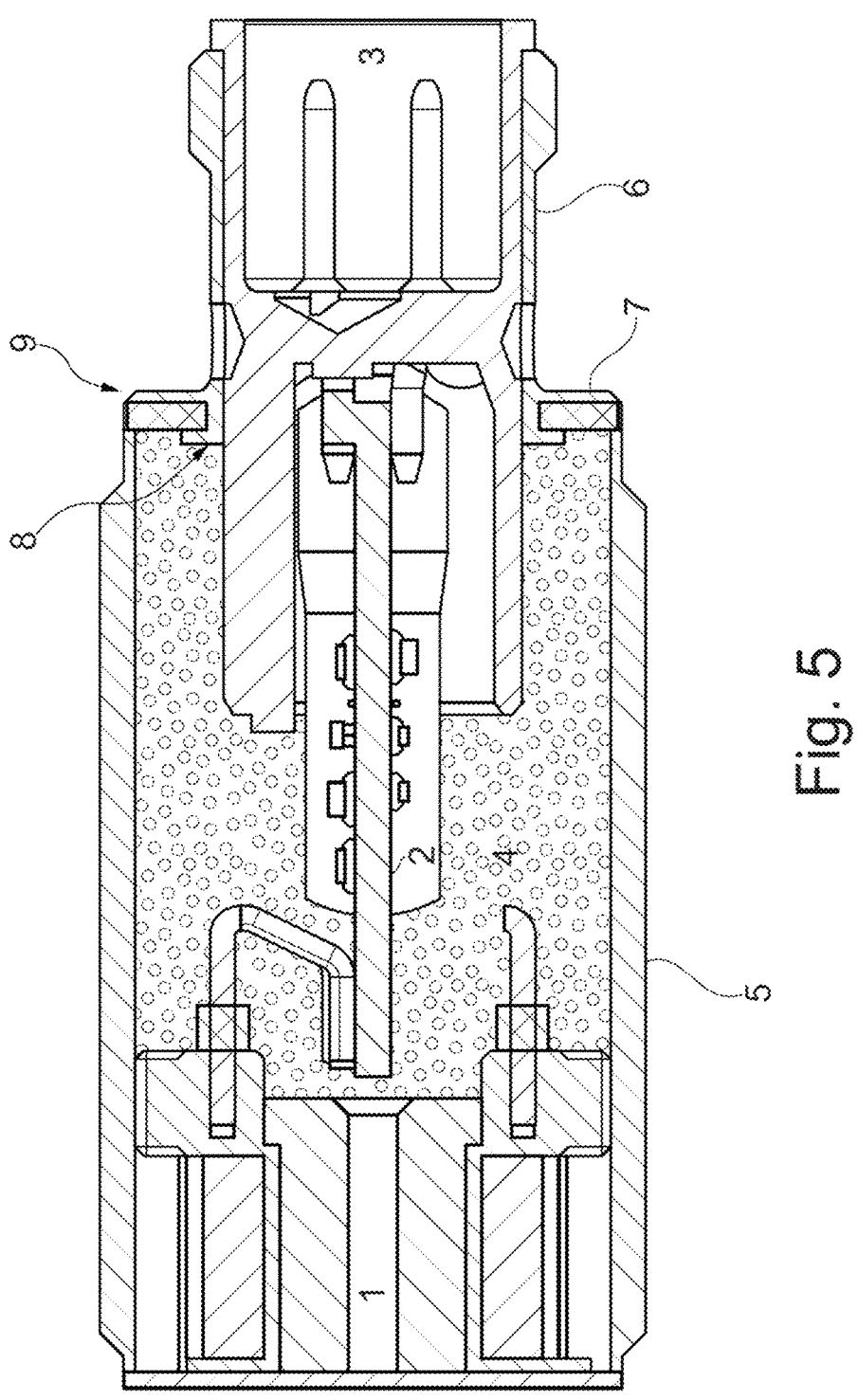
FIG. 5 shows a structural unit as described in DE 10 2017 201 320 B3.

FIGS. 4b to 4e show details of the connection between the sensor board 109 and the electronics board 108. Only a portion of the electronics board 108 is illustrated in FIGS. 4b to d such that the connection illustrated in FIGS. 3c and 4a cannot be seen. FIG. 4e shows schematically the sensor-side contacting pads on the sensor board 109, designated there with the reference symbol 122. A total of six such contacting pads 123 are provided. These are arranged such that, in the case of the arrangement of the sensor board 109 perpendicular to the electronics board 108, they are arranged directly opposite the corresponding sensor-side contacting pads 122 on the electronics board 108.

The solder points designated in the FIGS. with the reference symbol 124 can thus then also be produced in the manner of a solder fillet. All six solder fillets of the connection of the sensor board 109 to the electronics board are advantageously produced in a single selective soldering step.

It can be provided that three solder points are arranged in each case per side, i.e. on the upper and lower side of the electronics board. These three solder points can advantageously be produced in a single selective soldering step, for example by simultaneous wetting of the three pads with the soldering finger. The other side with the three solder pads can then be soldered in a second step after the board has been turned over. Optionally, the soldering finger can only approach the solder pads from "below" in order to wet them.

It can, however, be provided in a further aspect, wherein two simultaneously used soldering fingers are used to simultaneously solder one side of the board with three solder points of the sensor board 109 to the electronics board 108 and the contacting of the plug pins 113 and the soldering lug 118 with the electronics board 108.

After joining by soldering and connecting the elements and then injection-overmolding with the injection-molded sleeve 110, the front cap 106 is then plugged over the sensor board 109 and the whole structural unit 105 and the front cap 106 is introduced into the housing 100 from the front side.

The housing is then crimped at the rear side at the tapered end, which is provided in FIG. 1c with the reference symbol 114, in order to achieve captive fixing.

Where individual features are shown in the figures and described herein, it is intended that they are also protectable separately and independently form an disclosure.

Optionally, the crescent-shaped or banana-shaped contacts, and/or the arrangement of the pins 113 which form the electronics board, can independently form an disclosure.

The selective soldering, and/or the soldering by a mini-wave, optionally in one step, can moreover independently form an disclosure.

The assembly in the present case is produced, for example, fully automatically by the structural unit 105 consisting of the electronics board 108, the sensor board 109, and the plug first being prefabricated from the corresponding individual parts. For example, only two selective soldering steps are required in each case because both sides of the electronics board 108 in each case have three solder pads for contacting the sensor board 109 (front region) and three solder pads for contacting the plug and soldering lugs (rear region of the board). This automatic method can also independently be the subject of a disclosure.

LIST OF REFERENCE SYMBOLS 1 sensor unit
2 circuit carrier
3 plug
4 flexible polyurethane foam
5 cylindrical section
6 threaded tube
7 perforated disk
100 housing
101 front opening
102 collar
103 rear-side opening
104 internal circumferential surface
105 structural unit
106 front cap
107 plug
108 electronics board
109 sensor board
110 injection-molded sleeve
112 plug housing
113 pin
114 tapered end
116 plug-side contacting pad
117 sheet-metal ring
118 soldering lugs
119 press-fit lugs
120 ground contacting pad
121 capacitor
122 sensor-side contacting pad
123 contacting pad of the sensor board
124 solder point

What is claimed is:

1. An electronic assembly comprising:
a housing, a plug, an electronics board, a sensor board, and a front cap;
wherein the housing includes, from a rear side to a front side thereof, in succession the plug, the electronics board, the sensor board, and the front cap;
wherein a collar, on which an axial end face of the plug is supported, is provided at the rear side of the housing such that the plug is held in the housing with respect to the rear side of the housing;
wherein the plug, the electronics board, and the sensor board form an assembled structural unit;
wherein a front of the housing is crimped around the front cap to fix the structural unit in the housing and press the structural unit against the collar; and wherein the electronic assembly includes an injection-molded sleeve surrounding the structural unit at least partly, the injection-molded sleeve being made from thermoplastic, wherein a contour of the injection-molded sleeve leaves free a radial buffer region for thermal expansion relative to the housing, and wherein the structural unit forms a unit with the injection-molded sleeve, the injection-molded sleeve being held only by the crimped front side of the housing and the collar at the rear side of the housing.

2. The electronic assembly according to claim 1,
wherein the plug includes a plug housing and plug pins which are held in the plug housing, and
wherein rear-side ends of the plug pins are in contact with a first end of the electronics board and are crescent-shaped.

3. The electronic assembly according to claim 2, wherein the plug pins are arranged in the plug housing such that the crescent-shaped rear-side ends of the plug pins are situated opposite one another and their bulges are applied between them against the electronics board at corresponding contacting pads and pre-fix the corresponding contacting pads.

4. The electronic assembly according to claim 2, the electronic assembly comprising a grounding element provided between the electronics board and the housing at an end of the plug housing at which the electronics board is situated.

5. The electronic assembly according to claim 4, wherein the grounding element is formed by a sheet-metal ring which includes at least one soldering lug for contacting a ground contact pad of the electronics board, the contact pad being connected to a capacitor on the electronics board, and wherein the sheet-metal ring includes at least one press-fit lug protruding therefrom, wherein the one press-fit lug establishes an electrically conductive contact with the housing.

6. The electronic assembly according to claim 1, wherein the injection-molded sleeve is produced by a low-pressure injection-molding method.

7. The electronic assembly according to claim 1, wherein the structural unit is one of following types of sensor: a proximity sensor, an inductive sensor, a capacitive sensor, a pressure sensor, a gas sensor, a temperature sensor, a moisture sensor, an ultrasound sensor, a vibration detection sensor, or a UV sensor.

8. A method for producing an electronic assembly according to claim 1, the method comprising:
contacting rear ends of pins of the plug with a first end of the electronics board and contacting contacts of the sensor board with corresponding contacts of the electronics board at a second end of the electronics board such that the plug, the electronics board, and the sensor board form the assembled structural unit;
inserting the structural unit into the housing from the front side toward the rear side of the housing until the axial end face of the plug is supported on the collar at the rear side of the housing;
closing the housing at the front side with the front cap;
crimping the rear side of the housing around the front cap such that the structural unit is fixed in the housing and pressed against the collar; and
injection-overmolding the structural unit such that the structural unit is at least partly surrounded by the injection-molded sleeve.

9. The method according to claim 8, wherein the contacting of a rear-side end of the pins of the plug with the first end of the electronics board and/or the contacting of the contacts of the sensor board with the corresponding contacts of the electronics board at the second end of the electronics board are affected by a selective soldering process and/or wave soldering process.

10. The method according to claim 8, wherein all the contacts between the plug and the electronics board are made in a single uninterrupted soldering step, and/or all the contacts between the sensor board and the electronics board are made in a single further uninterrupted soldering step.

11. The method according to claim 8, wherein simultaneously one side of the board is soldered with solder points of the sensor board to the electronics board and the contacting of the plug pins, as well as a soldering lug, with the electronics board is soldered.

12. The method according to claim 8, wherein the method is performed in an automated manner and, optionally, individual steps are not performed manually.

\* \* \* \* \*